| (12) | United States Patent | (10) Patent No.: US 11,205,702 B2 |
|---|---|---|
| | Figuet et al. | (45) Date of Patent: Dec. 21, 2021 |

(54) METHOD FOR MANUFACTURING A STRUCTURE FOR FORMING A TRIDIMENSIONAL MONOLITHIC INTEGRATED CIRCUIT

(71) Applicant: Soitec, Bernin (FR)

(72) Inventors: Christophe Figuet, Crolles (FR); Ludovic Ecarnot, Vaulnaveys-le-Haut (FR); Bich-Yen Nguyen, Austin, TX (US); Walter Schwarzenbach, Saint Nazaire les Eymes (FR); Daniel Delprat, Crolles (FR); Ionut Radu, Crolles (FR)

(73) Assignee: Soitec, Bernin (FR)

( * ) Notice: Subject to any disclaimer, the term of this patent is extended or adjusted under 35 U.S.C. 154(b) by 444 days.

(21) Appl. No.: 16/086,275

(22) PCT Filed: Mar. 31, 2017

(86) PCT No.: PCT/EP2017/057717
§ 371 (c)(1),
(2) Date: Sep. 18, 2018

(87) PCT Pub. No.: WO2017/167976
PCT Pub. Date: Oct. 5, 2017

(65) Prior Publication Data
US 2020/0295138 A1    Sep. 17, 2020

(30) Foreign Application Priority Data
Mar. 31, 2016  (FR) ..................... 1652768

(51) Int. Cl.
*H01L 29/161* (2006.01)
*H01L 23/00* (2006.01)
*H01L 21/306* (2006.01)

(52) U.S. Cl.
CPC ...... *H01L 29/161* (2013.01); *H01L 21/30604* (2013.01); *H01L 24/83* (2013.01); *H01L 2224/83894* (2013.01)

(58) Field of Classification Search
CPC ....... H01L 2224/83894–83895; H01L 21/187; H01L 2224/48145–48147; H01L 21/185
See application file for complete search history.

(56) References Cited

U.S. PATENT DOCUMENTS 5,663,078 A * 9/1997 McCarthy ......... H01L 29/78648
                                                      438/157
2008/0128868 A1   6/2008 Aspar
(Continued)

FOREIGN PATENT DOCUMENTS

FR          3006236 A1      12/2014
KR   10-2007-0086316 A       8/2007
(Continued)

OTHER PUBLICATIONS

Taiwanese Search Report and Office Action from Taiwanese Application No. 106111032, dated Mar. 18, 2020, 11 pages.
(Continued)

*Primary Examiner* — Amar Movva
(74) *Attorney, Agent, or Firm* — TraskBritt

(57) ABSTRACT

A method for manufacturing a structure comprising a first substrate comprising at least one electronic component likely to be damaged by a temperature higher than 400° C. and a semiconductor layer extending on the first substrate comprises:
(a) providing a first bonding metal layer on the first substrate,
(b) providing a second substrate comprising successively:
 a semiconductor base substrate,
 a stack of a plurality of semiconductor epitaxial layers, a layer of $Si_xGe_{1-x}$, with $0 \le x \le 1$ being located at the surface of said stack opposite to the base substrate, and
 a second bonding metal layer,
(Continued)

(c) bonding the first substrate and the second substrate through the first and second bonding metal layers at a temperature lower than or equal to 400° C., and (d) removing a part of the second substrate so as to transfer the layer of $Si_xGe_{1-x}$ on the first substrate using a selective etching process.

18 Claims, 3 Drawing Sheets

(56) References Cited

U.S. PATENT DOCUMENTS

| | | |
|---|---|---|
| 2011/0076849 A1 | 3/2011 | Blanchard |
| 2014/0273318 A1 | 9/2014 | Ryu et al. |
| 2015/0279888 A1* | 10/2015 | Chen ................. H01L 27/14634 257/459 |
| 2016/0035833 A1 | 2/2016 | Brindle et al. |

FOREIGN PATENT DOCUMENTS

| | | |
|---|---|---|
| TW | 201041164 A | 11/2010 |
| TW | 201143123 A | 12/2011 |
| TW | 201539725 A | 10/2015 |
| WO | 02/33746 A1 | 4/2002 |

OTHER PUBLICATIONS

International Written Opinion for International Application No. PCT/EP2017/057717 dated Jun. 23, 2017, 7 pages.
International Search Report for International Application No. PCT/EP2017/057717 dated Jun. 23, 2017, 4 pages.
European Communication pursuant to Article 94(3) EPC for European Application No. 17715662, dated Aug. 30, 2019, 4 pages.
Singapore Written Opinion for Singapore Application No. 11201808193S dated Jul. 10, 2019, 6 pages.
Korean Notice of Reasons for Rejection for Korean Application No. 10-2018-7031346, dated Jul. 24, 2020, 12 pages with English Translation.
Korean Notice of Final Rejection for Korean Application No. 10-2018-7031346 dated Aug. 31, 2021, 4 pages.

* cited by examiner

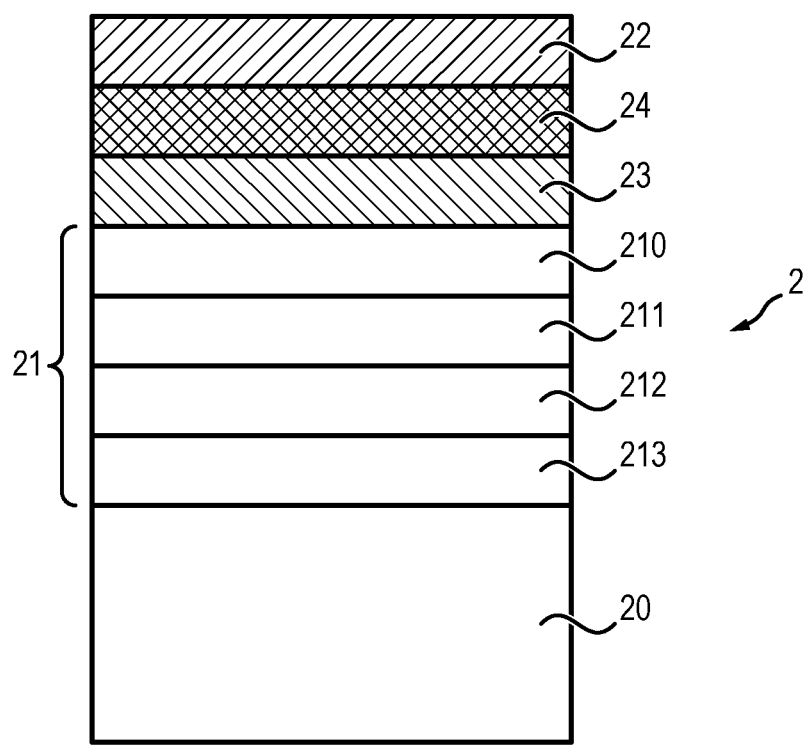
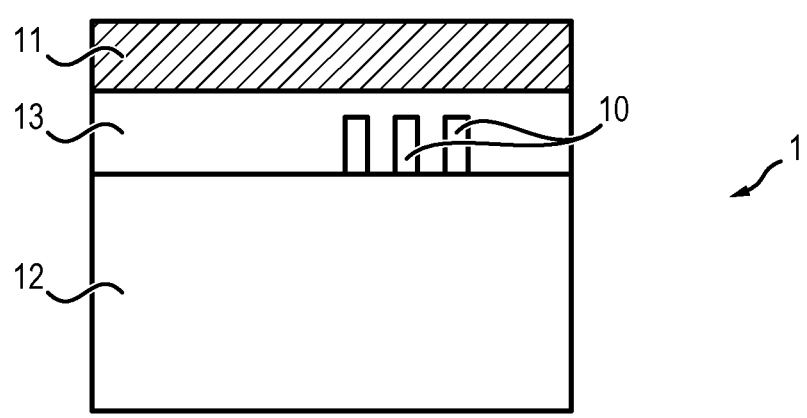

METHOD FOR MANUFACTURING A STRUCTURE FOR FORMING A TRIDIMENSIONAL MONOLITHIC INTEGRATED CIRCUIT

CROSS-REFERENCE TO RELATED APPLICATIONS

This application is a national phase entry under 35 U.S.C. § 371 of International Patent Application PCT/EP2017/057717, filed Mar. 31, 2017, designating the United States of America and published in English as International Patent Publication WO 2017/167976 A1 on Oct. 5, 2017, which claims the benefit under Article 8 of the Patent Cooperation Treaty to French Patent Application Ser. No. 1652768, filed Mar. 31, 2016.

TECHNICAL FIELD

The present application relates to a method for manufacturing a structure for forming a monolithic integrated circuit, as well as a structure and a substrate intended to be used for implementing the method.

BACKGROUND

Tridimensional (3D) monolithic integrated circuits are particularly promising in view of increasing the density and decreasing the size of electronic components, because they especially avoid misalignment problems of the components.

The manufacture of such circuits involves transferring a semiconductor layer onto a substrate already comprising at least one electric component, for example a transistor.

However, such a transfer is at issue when the component is likely to be damaged when subjected to a temperature higher than 400° C.

Indeed, to date there is no method enabling a semiconductor layer with a good crystal quality to be transferred and involving only steps that can be implemented at a temperature lower than 400° C.

Thus, a first option will be to form the semiconductor layer by directly depositing it onto the substrate comprising at least one electronic component. However, such a deposition made at a temperature lower than 400° C. results in obtaining a polycrystalline or amorphous layer, not having the required crystal quality for the subsequent formation of other electronic components.

Another option will be to use the SMART CUT® method which is well known to transfer a semiconductor layer from a donor substrate to an acceptor substrate. This method involves forming a weakened zone in the donor substrate by implanting atomic species, such as hydrogen and/or helium. However, this implantation generates defects in the transferred layer, which can only be cured to date by an annealing at a temperature higher than 500° C.

The so-called BSOI (Bonded Silicon-On-Insulator) and BESOI (Bonded and Etched-Back Silicon-On-Insulator) techniques could be contemplated to transfer a silicon layer from a bulk substrate bonded to a substrate comprising at least one electronic component. However, these techniques enable neither very thin layers to be formed nor a satisfactory bonding energy to be achieved if the temperatures used do not exceed 400° C.

BRIEF SUMMARY

One purpose of the disclosure is thus to design a method for manufacturing a structure comprising a first substrate comprising at least one electronic component likely to be damaged by a temperature higher than 400° C. and a semiconductor layer extending on the first substrate, which enables a semiconductor layer having the required properties for the intended application and which provides a good adhesion between the semiconductor layer and the first substrate to be obtained, without using a temperature higher than 400° C.

In accordance with the disclosure, a method for manufacturing a structure is provided comprising a first substrate comprising at least one electronic component likely to be damaged by a temperature higher than 400° C. and a semiconductor layer extending on the first substrate, wherein the method comprises the following steps of:

(a) providing a first bonding metal layer on the first substrate, called an acceptor substrate, (b) providing a second substrate, called a donor substrate, comprising successively:
 a semiconductor base substrate,
 a stack of a plurality of semiconductor epitaxial layers, a layer of $Si_xGe_{1-x}$, with $0 \leq x \leq 1$ being located at the surface of the stack opposite to the base substrate,
 a second bonding metal layer, (c) bonding the first substrate and the second substrate through the first and second bonding metal layers, the bonding step being carried out at a temperature lower than or equal to 400° C., (d) removing a part of the second substrate so as to transfer the layer of $Si_xGe_{1-x}$ on the first substrate, the removing comprising at least selectively chemically etching a layer of the second substrate relative to the $Si_xGe_{1-x}$ layer.

Thus, the layer of $Si_xGe_{1-x}$, has both an excellent crystal quality and a mobility of charge carriers which is higher than that of a relaxed single crystal silicon layer. Consequently, the structure formed is optimum for manufacturing tridimensional monolithic integrated circuits for high performance and/or low power applications.

On the other hand, metal-metal bonding provides strong bonding energy even at a temperature not exceeding 400° C., this energy being substantially higher than that provided by a dielectric-dielectric bonding made at such a temperature. Further, the metal-metal interface has the advantage, unlike a dielectric-dielectric interface, not to be attacked by a hydrofluoric acid solution possibly employed for selectively etching at least one layer of the second substrate.

In the present text, a "layer A on the layer B" type or "layer B underlying the layer A" type phrase does not necessarily imply that layers A and B have a common interface; they indeed can be separated by one or more intermediate layers. On the other hand, the "layer A directly on layer B" phrase means that layers A and B are contacting with each other.

According to one embodiment, the second substrate comprises a dielectric layer between the layer of $Si_xGe_{1-x}$, and the second bonding metal layer.

The thickness of the dielectric layer is advantageously between 10 and 20 nm.

According to one embodiment, the base substrate is a silicon substrate.

According to a preferred embodiment, the stack successively comprises, from the base substrate:
 a layer of silicon-germanium having a composition gradually varying over its thickness,
 a layer of silicon-germanium having a constant composition over its thickness, a layer of $Si_yGe_{1-y}$, with 0≤y≤1 and y different from x, the layer of $Si_yGe_{1-y}$ having a different composition from that of the layer of silicon-germanium having a constant composition over its thickness so as to make up an etching barrier layer toward the layer of $Si_xGe_{1-x}$, the layer of $Si_xGe_{1-x}$.

Particularly advantageously:

the composition of the layer of silicon-germanium having a composition gradually varying over its thickness is $Si_{0.8}Ge_{0.2}$ at the surface of the layer opposite to the base substrate, the composition of the layer of silicon-germanium having a constant composition over its thickness is $Si_{0.8}Ge_{0.2}$, the thickness of the layer being between 0.5 µm and 2 µm, the composition of the etching barrier layer is chosen from Si and $Si_{0.6}Ge_{0.4}$, the thickness of the layer being between 10 nm and 50 nm, the composition of the layer of $Si_xGe_{1-x}$, is chosen from $Si_{0.8}Ge_{0.2}$, Si and Ge, the thickness of the layer being between 5 and 50 nm.

The first and second bonding metal layers can comprise titanium, nickel, copper and/or tungsten.

According to one embodiment, step (b) comprises the following successive steps of:

epitaxially growing a layer of silicon-germanium with a gradual composition over its thickness, epitaxially growing a layer of silicon-germanium with a constant composition over its thickness, polishing the layer of silicon-germanium with a constant composition, epitaxially growing a layer of $Si_yGe_{1-y}$, with 0≤y≤1 and y different from x on the polished layer of silicon-germanium, the layer of $Si_yGe_{1-y}$ having a different composition from that of the layer of silicon-germanium having a constant composition over its thickness, epitaxially growing the layer of $Si_xGe_{1-x}$, on the layer of $Si_yGe_{1-y}$, depositing the second bonding metal layer.

According to one embodiment, step (b) comprises, between the step of epitaxially growing the layer of $Si_xGe_{1-x}$ and the step of depositing the second bonding metal layer, a step of depositing a dielectric layer.

Step (b) can comprise, after the step of depositing the dielectric layer, a densification annealing of the layer.

Particularly advantageously, step (b) further comprises forming, between the dielectric layer and the second bonding metal layer, a layer of a binary or ternary metal alloy.

According to one embodiment, step (d) comprises withdrawing a part of the thickness of the base substrate by polishing, followed by selectively etching the rest of the base substrate.

Particularly advantageously, etching the base substrate is made with a TMAH, KOH, and/or $HF:HNO_3$ solution.

On the other hand, removing the base substrate can be followed by selectively etching the layers of silicon-germanium with a constant composition and a gradual composition by means of a SC1 solution and/or a $HF:H_2O_2:CH_3COOH$ solution.

Another object relates to a method for manufacturing a tridimensional monolithic integrated circuit, comprising implementing the method described above.

More precisely, this method for manufacturing a tridimensional monolithic integrated circuit, comprises:

manufacturing a structure comprising a first substrate comprising at least one electronic component likely to be damaged by a temperature higher than 400° C. and a layer of $Si_xGe_{1-x}$ extending on the first substrate by means of the method described above, manufacturing at least one other electronic component in or on the layer of $Si_xGe_{1-x}$.

The method is remarkable in that all the steps implemented on the structure are made at a temperature lower than or equal to 400° C.

Another object relates to a structure likely to be obtained by the method described above.

The structure comprises a first substrate comprising at least one electronic component likely to be damaged by a temperature higher than 400° C. and a semiconductor layer extending on the first substrate, and wherein the semiconductor layer is a layer of $Si_xGe_{1-x}$, with 0≤x≤1 and wherein the structure comprises, between the first substrate and the semiconductor layer, a metal layer.

According to one embodiment, the structure further comprises a dielectric layer between the metal layer and the semiconductor layer.

Advantageously, the structure comprises, between the metal layer and the dielectric layer, a layer of a binary or ternary metal alloy.

The at least one electronic component can comprise a transistor, a memory, a photodetector, a diode, a laser, a switch, an amplifier and/or a filter.

Another object relates to a donor substrate intended to be used in the method described above.

This donor substrate successively comprises:

a semiconductor base substrate, a stack of a plurality of semiconductor epitaxial layers, a layer of $Si_xGe_{1-x}$, with 0≤x≤1, being located at the surface of the stack opposite to the base substrate, a bonding metal layer.

According to one embodiment, the donor substrate further comprises a dielectric layer between the layer of $Si_xGe_{1-x}$ and the metal layer.

The dielectric layer can have a thickness between 10 and 20 nm.

According to one embodiment, the base substrate is a silicon substrate.

According to one preferred embodiment, the stack successively comprises, from the base substrate:

a layer of silicon-germanium having a composition gradually varying over its thickness, a layer of silicon-germanium having a constant composition over its thickness, a layer of $Si_yGe_{1-y}$, with 0≤y≤1 and y different from x, the layer of $Si_yGe_{1-y}$ having a different composition from that of the layer of silicon-germanium having a constant composition over its thickness so as to make up an etching barrier layer toward the layer of $Si_xGe_{1-x}$, the layer of $Si_xGe_{1-x}$.

BRIEF DESCRIPTION OF THE DRAWINGS

Further characteristics and advantages of the disclosure will appear from the detailed description that follows, in reference to the accompanying drawings in which:

FIGS. 1A to 1C are cross-sectional views of a donor substrate according to various embodiments of the disclosure;

FIG. 2 is a cross-sectional view of an acceptor substrate comprising at least one electronic component.

It is set out that for the sake of legibility of the figures, the different elements illustrated are not necessarily represented to scale. Identical reference signs from one figure to the other designate identical elements or elements providing the same function.

DETAILED DESCRIPTION

Figure 1A:
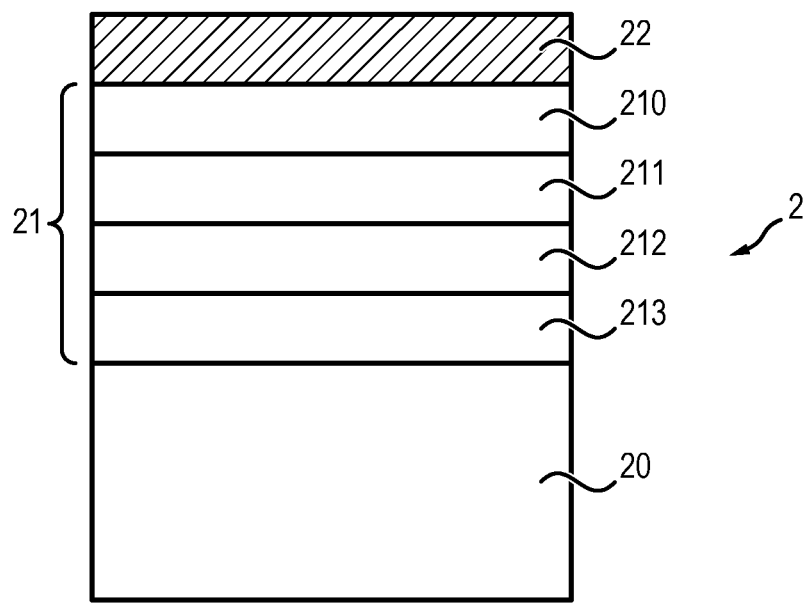
Figure 1B:
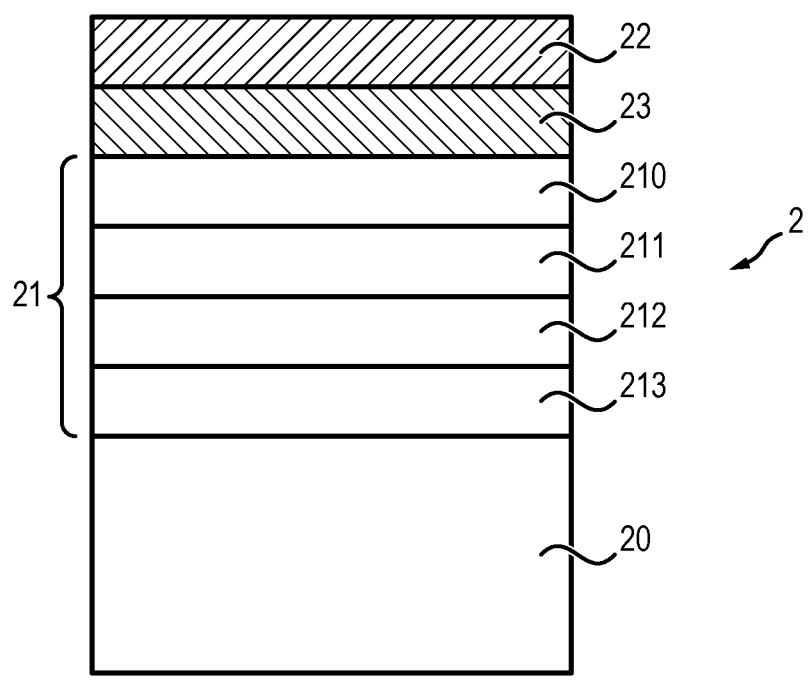

FIGS. 1A to 1C illustrate various alternatives of the donor substrate.

Generally, the donor substrate comprises successively:
a base substrate 20,
a stack 21 of a plurality of semiconductor epitaxial layers, among which a layer 210 of $Si_xGe_{1-x}$, with $0 \le x \le 1$, which is located at the surface of the stack that is opposite to the base substrate 20, the layer being intended to be transferred to another substrate to form the final structure,
a bonding metal layer 22.

The base substrate 20 is of a semiconductor material, or a stack of different semiconductor materials. According to one particular embodiment, the base substrate is of bulk single crystal silicon.

In FIGS. 1A to 1C, the stack 21 is represented as four layers 213, 212, 211 and 210. However, those skilled in the art could vary the number of layers and their compositions without departing from the scope of the disclosure, as long as a layer underlying the layer 210 makes up an etching barrier layer. In other words, it is possible to implement selective etching of at least one of the layers of the stack relative to the layer 210.

Advantageously, the layers of the stack are silicon, germanium and/or silicon-germanium layers. GaP can possibly be used because this material has a lattice parameter close to that of silicon. Those skilled in the art are able to choose the composition of each layer (which can be, depending on the cases, constant or gradual over the thickness) depending on the desired properties for the layer 210.

According to a preferred embodiment, the layer 213 which is formed by epitaxy on the base substrate 20 is a layer of SiGe having a composition gradually varying over its thickness, such that the final composition of the layer (i.e., at the surface opposite to the base substrate 20) is for example $Si_{0.8}Ge_{0.2}$.

A layer 212 of silicon-germanium with an identical composition to the final composition of the layer 213 (that is, in this example, $Si_{0.8}Ge_{0.2}$) is formed by epitaxy on the layer 213. The composition of the layer 212 is constant over its thickness. The layer 212 is thick, that is having typically a thickness between 0.5 µm and 2 µm. Particularly advantageously, a polishing of the surface of the layer 212 is performed before continuing the epitaxy.

A layer 211 of a different material from that of the layer 212 (for example of silicon or of $Si_{0.6}Ge_{0.4}$ if the layer 212 is of $Si_{0.8}Ge_{0.2}$) is formed by epitaxy on the layer 212. The thickness of the layer 211 is in the order of 10 to 50 nm. The layer 211 is an etching barrier layer toward the underlying layers 212, 213. Those skilled in the art are capable of choosing the composition of the layer 211 to provide a sufficient etching selectivity such that etching the base substrate and/or the layers 212, 213 does not attack the overlying layer 210.

The layer 210 is formed by epitaxy on the layer 211. The layer 210 is intended to be transferred onto another substrate to form the final structure, as will be explained below. The layer 210 is of a different material from that making up the etching barrier layer 211. For example, the layer 210 has the composition $Si_xGe_{1-x}$, with $0 \le x \le 1$, the material of the layer being possibly restrained depending on the lattice parameter difference relative to the underlying layer 211. For example, the layer 210 can be of $Si_{0.8}Ge_{0.2}$, of silicon or of germanium. The thickness of the layer 210 is typically between 5 and 50 nm.

The metal layer 22 can be formed by one of the following materials: nickel, copper, tungsten, or titanium. The layer is generally deposited by one of the following techniques: physical vapor deposition (PVD), electro-deposition, chemical vapor deposition (CVD). The thickness of the metal layer 22 is typically between 10 and 1000 nm.

In the embodiment of FIG. 1A, the metal layer 22 is directly deposited onto the layer 210.

In the embodiment of FIG. 1B, a dielectric layer 23 is deposited onto the layer 210 before depositing the metal layer 22. Such a dielectric layer is particularly interesting for a back-gate type application for which a buried oxide is needed. The dielectric layer advantageously has a very low thickness (typically between 10 and 20 nm). Such a thin layer is thereby not altered by a possible HF etching because the edge attack surface is low for this thickness range. The dielectric layer 23 is generally deposited by one of the following techniques: plasma enhanced chemical vapor deposition (PECVD), atomic layer deposition (ALD), low pressure chemical vapor deposition (LPCVD), PVD. Depositing the dielectric layer can be followed by a densification annealing.

In the embodiment of FIG. 1C, a layer 24 of a binary or ternary metal alloy is deposited onto the dielectric layer 23 before depositing the metal layer 22. The layer 24 has the advantage of promoting adhesion of the metal layer 22 onto the dielectric layer 23.

The donor substrate thus formed can be bonded to another substrate, called an acceptor substrate which comprises at least one electronic component likely to be damaged by a temperature higher than 400° C.

Such an electronic component can for example be a transistor, a memory, a photodetector, a diode, a laser, a switch, an amplifier, a filter or a combination of these components.

FIG. 2 illustrates one embodiment of an acceptor substrate 1.

The substrate 1 comprises a base substrate 12, for example of bulk silicon, which supports a dielectric layer 13 containing a plurality of electronic components 10 in the form of transistors. The transistors are of the FinFET (Fin Field Effect Transistor) type, which have a non planar structure.

To bond the acceptor substrate to the donor substrate, a bonding metal layer 11 is advantageously formed on the surface of the acceptor substrate 1 intended to form the bonding interface. The bonding metal layer 11 can be made of one of the following materials: nickel, titanium, tungsten, or copper.

Figure 3:
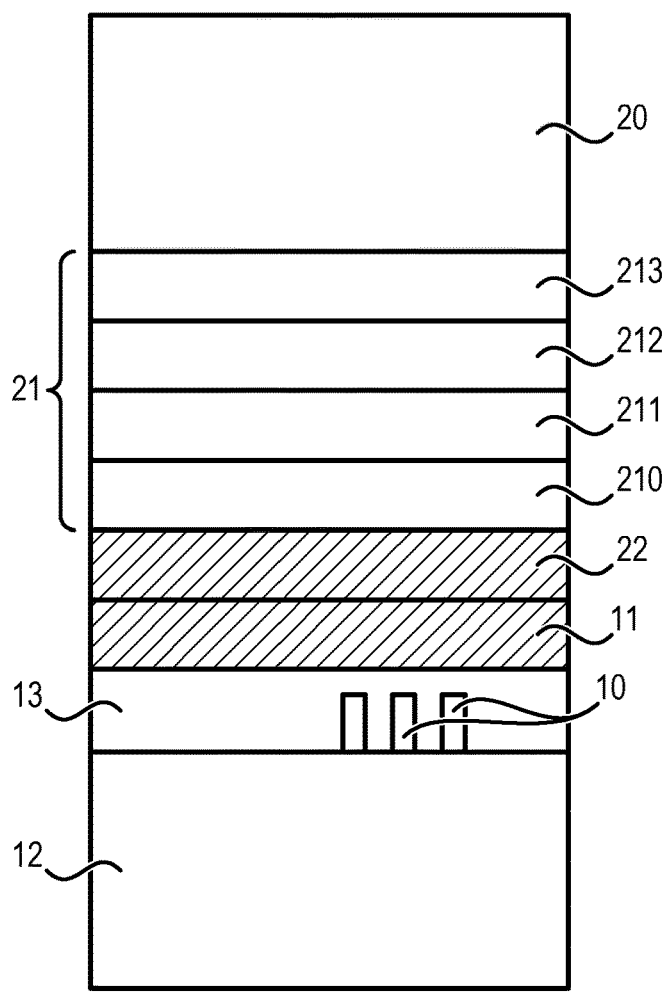
FIGS. 3 and 4 illustrate successive steps of the method for manufacturing the structure according to one embodiment of the disclosure.

Then, as illustrated in FIG. 3, the donor substrate and acceptor substrate are bonded through bonding layers 22 and 11. In this illustration, the donor substrate is that of FIG. 1A, but it could naturally be that of FIG. 1B or that of FIG. 1C.

Such metal-metal bonding can be made at a low temperature, that is, at a temperature lower than 400° C., while providing a high bonding energy. Thus, the bonding step does not damage the electronic components 10.

On the other hand, if a back gate function is necessary in the final structure, the metal layer 11, 22 can fulfil this function.

Figure 4:
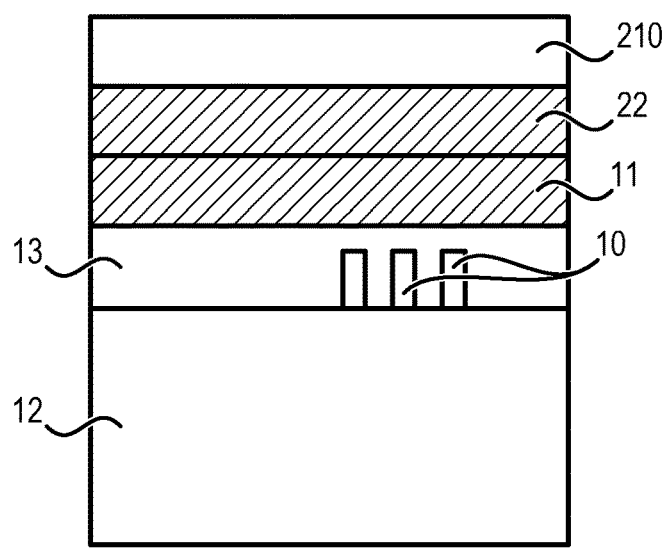

In reference to FIG. 4, the layer 210 is transferred from the donor substrate to the acceptor substrate by implementing at least one etching step so as to detach the layer 210 from the underlying layers of the substrate 2. The etching must be selective relative to the layer 210 in order not to damage it.

First of all, a mechanical polishing (also called "grinding") of the base substrate 20 can be implemented. This polishing can include a first coarse polishing step followed by a fine polishing step. Most of the base substrate 20 can thereby be removed until a thickness of a few microns remains.

Secondly, the rest of the base substrate 20 can be removed by dry polishing or chemical etching. In the case of a silicon substrate, the etching composition is advantageously TMAH, KOH, or $HF:HNO_3$.

Thirdly, the layers 213 and 212 can be removed by dry etching or chemical etching. In the case of layers of silicon-germanium, the etching composition can be a composition SC1 ($NH_4OH:H_2O_2:H_2O$) or $HF:H_2O_2:CH_3COOH$.

Possibly, if the etching selectivity permits it, the layer 211 can also be removed by etching. Otherwise, the layer 211 can be removed by dry polishing.

Optionally, the different abovementioned etching steps can be implemented by combining different etching compositions. Those skilled in the art are able to define the suitable composition depending on the material to be etched.

From the structure represented in FIG. 4, at least one other electronic component (not illustrated) can be manufactured in or on the layer 210 of $Si_xGe_{1-x}$.

Finally, the examples just described are of course only particular and in no way limiting illustrations as regards the application fields of the disclosure.

The invention claimed is:

1. A method for manufacturing a structure comprising a first substrate comprising at least one electronic component and a semiconductor layer extending on said first substrate, the method comprising the following steps:
   (a) providing a first bonding metal layer on the first substrate;
   (b) providing a second substrate comprising successively:
      a semiconductor base substrate,
      a stack of a plurality of semiconductor epitaxial layers, a layer of $Si_xGe_{1-x}$, with $0 \leq x \leq 1$ being located at the surface of the stack opposite to the base substrate, and
      a second bonding metal layer;
   (c) bonding the first substrate and the second substrate through the first and second bonding metal layers, the bonding step being carried out at a temperature lower than or equal to 400° C.; and
   (d) removing a part of the second substrate so as to transfer the layer of $Si_xGe_{1-x}$ onto the first substrate, the removing comprising at least selectively chemically etching a layer of the second substrate relative to the $Si_xGe_{1-x}$ layer.

2. The method of claim 1, wherein the second substrate comprises a dielectric layer between the layer of $Si_xGe_{1-x}$ and the second bonding metal layer.

3. The method of claim 2, wherein a thickness of the dielectric layer is between 10 and 20 nm.

4. The method of claim 1, wherein the base substrate is a silicon substrate.

5. The method of claim 1, wherein the stack successively comprises, from the base substrate:
   a layer of silicon-germanium having a composition gradually varying over its thickness;
   a layer of silicon-germanium having a constant composition over its thickness;
   a layer of $Si_yGe_{1-y}$, wherein $0 \leq y \leq 1$ and y different from x, the layer of $Si_yGe_{1-y}$ having a different composition from that of the layer of silicon-germanium having a constant composition over its thickness so as to constitute an etching barrier layer relative to the layer of $Si_xGe_{1-x}$; and
   the layer of $Si_xGe_{1-x}$.

6. The method of claim 5, wherein:
   the composition of the layer of silicon-germanium having a composition gradually varying over its thickness is $Si_{0.8}Ge_{0.2}$ at the surface of the layer opposite to the base substrate;
   the composition of the layer of silicon-germanium having a constant composition over its thickness is $Si_{0.8}Ge_{0.2}$, the thickness of the layer of silicon-germanium having a constant composition over its thickness being between 0.5 µm and 2 µm;
   the composition of the etching barrier layer is chosen from Si and $Si_{0.6}Ge_{0.4}$, the thickness of the etching barrier layer being between 10 nm and 50 nm; and
   the composition of the layer of $Si_xGe_{1-x}$ is chosen from $Si_{0.8}Ge_{0.2}$, Si and Ge, the thickness of the layer of $Si_xGe_{1-x}$ being between 5 and 50 nm.

7. The method of claim 1, wherein the first and second bonding metal layers comprise titanium, nickel, copper and/or tungsten.

8. The method of claim 1, wherein step (b) comprises the following successive steps:
   epitaxially growing a layer of silicon-germanium with a gradual composition;
   epitaxially growing a layer of silicon-germanium with a constant composition;
   polishing the layer of silicon-germanium with a constant composition;
   epitaxially growing a layer of $Si_yGe_{1-y}$, wherein $0 \leq y \leq 1$ and y is different from x on the polished layer of silicon-germanium, the layer of $Si_yGe_{1-y}$ having a different composition from that of the layer of silicon-germanium having a constant composition over its thickness;
   epitaxially growing the layer of $Si_xGe_{1-x}$ on the layer of $Si_yGe_{1-y}$; and
   depositing the second bonding metal layer.

9. The method of claim 8, wherein step (b) comprises, between the step of epitaxially growing the layer of $Si_xGe_{1-x}$ and the step of depositing the second bonding metal layer, a step of depositing a dielectric layer.

10. The method of claim 9, wherein step (b) comprises, after the step of depositing the dielectric layer, a densification annealing of the dielectric layer.

11. The method of claim 9, wherein step (b) further comprises forming, between the dielectric layer and the second bonding metal layer, a layer of a binary or ternary metal alloy.

12. The method of claim 1, wherein step (d) comprises removing a part of the thickness of the base substrate by polishing, followed by selectively etching a remainder of the base substrate.

13. The method of claim 12, wherein etching the base substrate comprises etching with a TMAH, KOH, and/or $HF:HNO_3$ solution.

14. The method of claim 12, wherein removing the base substrate is followed by selectively etching the layers of silicon-germanium with a constant composition and a gradual composition by means of a SC1 solution and/or a HF:H$_2$O$_2$:CH$_3$COOH solution.

15. A method for manufacturing a tridimensional monolithic integrated circuit, comprising:
   manufacturing the structure comprising the first substrate comprising at least one electronic component and the layer of Si$_x$Ge$_{1-x}$ extending on said first substrate by the method of claim 1, and
   manufacturing at least one other electronic component in or on the layer of Si$_x$Ge$_{1-x}$,
   wherein all the steps implemented on the structure are carried out at a temperature lower than or equal to 400° C.

16. A structure, comprising: a first substrate comprising at least one electronic component, a semiconductor layer extending on the first substrate, and a continuous metal layer between said first substrate and said semiconductor layer, wherein the continuous metal layer extends along the entire said first substrate and the semiconductor layer in a cross-section, wherein the semiconductor layer is a layer of Si$_x$Ge$_{1-x}$, wherein 0≤x≤1, wherein the structure successively comprises, from the at least one electronic component of the first substrate to the semiconductor layer:
   the continuous metal layer;
   a layer of a binary or ternary metal alloy; and
   a dielectric layer.

17. The structure of claim 16, wherein the at least one electronic component comprises a transistor, a memory, a photodetector, a diode, a laser, a switch, an amplifier and/or a filter.

18. A substrate, comprising:
   a semiconductor base substrate;
   a stack of a plurality of semiconductor epitaxial layers on the semiconductor base substrate, a layer of Si$_x$Ge$_{1-x}$, with 0≤x≤1, being located at the surface of the stack opposite to the base substrate; and
   a bonding metal layer on the stack of the plurality of semiconductor epitaxial layers on a side thereof opposite to the semiconductor base substrate; and
   wherein the stack successively comprises, from the base substrate:
      a layer of silicon-germanium having a composition gradually varying over its thickness;
      a layer of silicon-germanium having a constant composition over its thickness;
      a layer of Si$_y$Ge$_{1-y}$, wherein 0≤y≤1 and y different from x, the layer of Si$_y$Ge$_{1-y}$ having a different composition from that of the layer of silicon-germanium having a constant composition over its thickness so as to constitute an etching barrier layer relative to the layer of Si$_x$Ge$_{1-x}$; and
      the layer of Si$_x$Ge$_{1-x}$.

* * * * *